United States Patent [19]

Smith

[11] Patent Number: 5,380,398

[45] Date of Patent: Jan. 10, 1995

[54] METHOD FOR SELECTIVELY ETCHING ALGAAS

[75] Inventor: Lawrence E. Smith, Macungie, Pa.

[73] Assignee: AT&T Bell Laboratories, Murray Hill, N.J.

[21] Appl. No.: 982,194

[22] Filed: Nov. 25, 1992

[51] Int. Cl.⁶ .................... H01L 21/00; H01L 21/02; H01L 21/306; B44C 1/22

[52] U.S. Cl. .................. 156/643; 156/646; 156/654; 437/225; 437/228

[58] Field of Search .............. 156/643, 646, , 654; 437/225, 228

[56] References Cited

U.S. PATENT DOCUMENTS 4,705,593  11/1987  Haigh et al. ................ 156/643
5,043,776   8/1991  Hida ........................ 357/272

OTHER PUBLICATIONS

J. Vac. Sci. Technol., B9(6), Nov./Dec. 1991, "Selective Reactive Ion Etching and GaAs/AlGaAs Metal–Semiconductor Field," by Cameron et al., pp. 3538–3541.
J. Vac. Sci. Technol., B6(1), Jan./Feb. 1988, "Selective Reactive Ion Etching of GaAs on AlGaAs Using $CCl_2F_2$ and He," by A. Seabaugh, pp. 77–81.
Japanese Journal of Applied Physics, vol. 20, No. 11, Nov. 1981, "Selective Dry Etching of AlGaAs–GaAS Heterojunction," by Hikosaka, et al., pp. L847-L850.
J. Vac. Sci. Technol., B9(5), Sep./Oct. 1991, "Dry-etch Monitoring of III–V Heterostructures Using Laser Reflectometry and Optical Emission Spectroscopy," by Collot et al., pp. 2497–2502.
Solid State Technology, Nov. 1988, "Plasma Etching for III–V Compound Devices," by D. E. Ibbotson et al., pp. 105–108, 137–138.
Ibbotson, Plasma Etching for III–V Compound Devices, Part II, Solid State Tech., Nov. 1988, pp. 105–108.
Ehrlich, Laser-Induced Microscopic Etching of GaAs and InP, Appl. Phys. Lett. 36(8), Apr. 1980, pp. 698–700.
Asakawa, GaAs and GaAlAs Equi-Rate Etching Using a New Reactive Ion Beam Etching System, Jap. Jour. of Appl. Phys., vol. 22, No. 10, Oct. 1983, pp. L653–L655.

*Primary Examiner*—R. Bruce Breneman
*Assistant Examiner*—B. Everhart
*Attorney, Agent, or Firm*—Richard D. Laumann

[57] ABSTRACT

A method for semiconductor device fabrication that uses a mixture of $SiCl_4$, $CF_4$, $O_2$, and He to selectively etch GaAs with respect to AlGaAs. Etch selectivities greater than 300:1 are obtained.

7 Claims, 1 Drawing Sheet

METHOD FOR SELECTIVELY ETCHING ALGAAS

TECHNICAL FIELD

This invention relates generally to a method for selective etching of GaAs over AlGaAs and particularly to such a method that does not use chlorofluorocarbons.

BACKGROUND OF THE INVENTION

Although silicon is the most widely used semiconductor at the present time, Group III-V compound semiconductors are used in a wide variety of applications. For example, such semiconductors are widely used in microwave and opto-electronic applications. The devices used in such applications frequently have AlGaAs/GaAs present, and device fabrication frequently requires the selective etching of GaAs with respect to AlGaAs.

Accordingly, highly selective etches have been developed. Probably the most widely used is $CCl_2F_2$ or dichlorofluormethane. It is commonly known as Freon-12 and is nontoxic, nonflammable, and noncorrosive. Selectivities range from 200: to 600:1. See, for example, *Journal of Vacuum Science and Technology*, B9(6), by Cameron et al., Nov/Dec 1991, p. 3538, and *Journal of Vacuum Science and Technology*, B6(1), by Seabaugh, Jan/Feb 1988, p. 77, for reports of typical results. Although well suited for the etching described, it is a chlorofluorocarbon with a high ozone-depleting potential. As such, its use is undesirable and manufacture in the United States after 1995 is questionable.

He has long been used as an additive in etch chemistries. There are several reasons for adding He to a plasma. For example, it has a high thermal conductivity and may promote etch uniformity. Additionally, it may prevent or reduce polymer formation in C containing etches. For example, *Japanese Journal of Applied Physics*, 20, by K. Hikosaka et al., November 1981, pp. L847–L850 added He to a $CCl_2F_2$ system and observed a decrease in the GaAs etch rate. See, also, *Journal of Vacuum Science and Technology*, B9(5), by Collot et at., Sep/Oct 1991, pp. 2497-2502, for a report on etch chemistries using He.

There are, of course, many halogen-based species available. For example, hydrochlorofluorocarbons might be used, but they also have an ozone-depleting potential and are therefore undesirable. Still other alternatives mix chlorine- and fluorine-based species or oxygen- and chlorine-based species to obtain selectivity.

SUMMARY OF THE INVENTION

An exemplary embodiment of a method of fabricating a semiconductor device which includes etching GaAs/AlGaAs is described. The etching, which removes GaAs more rapidly than AlGaAs, uses a mixture of $SiCl_4$, $CF_4$, $O_2$, and an inert gas, such as He, for the etch. A resist on the GaAs is patterned to expose selected portions of the GaAs and the exposed GaAs is then etched. The etch has excellent selectivity between GaAs and AlGaAs which is further enhanced by the addition of the He. The addition of He reduces the etch rates of both GaAs and AlGaAs but reduces the etch rate of the latter semiconductor more than it does the etch rate of the former. More generally, the etch has selectivity between Al containing and non-Al containing compound semiconductors. That is, the etch has selectivity between first and second semiconductors of which one comprises Al. In a preferred embodiment, a desired selectivity between GaAs and AlGaAs is obtained by using a determined amount of He. In another preferred embodiment, the amount of undercutting is controlled.

DETAILED DESCRIPTION

Figure 1:
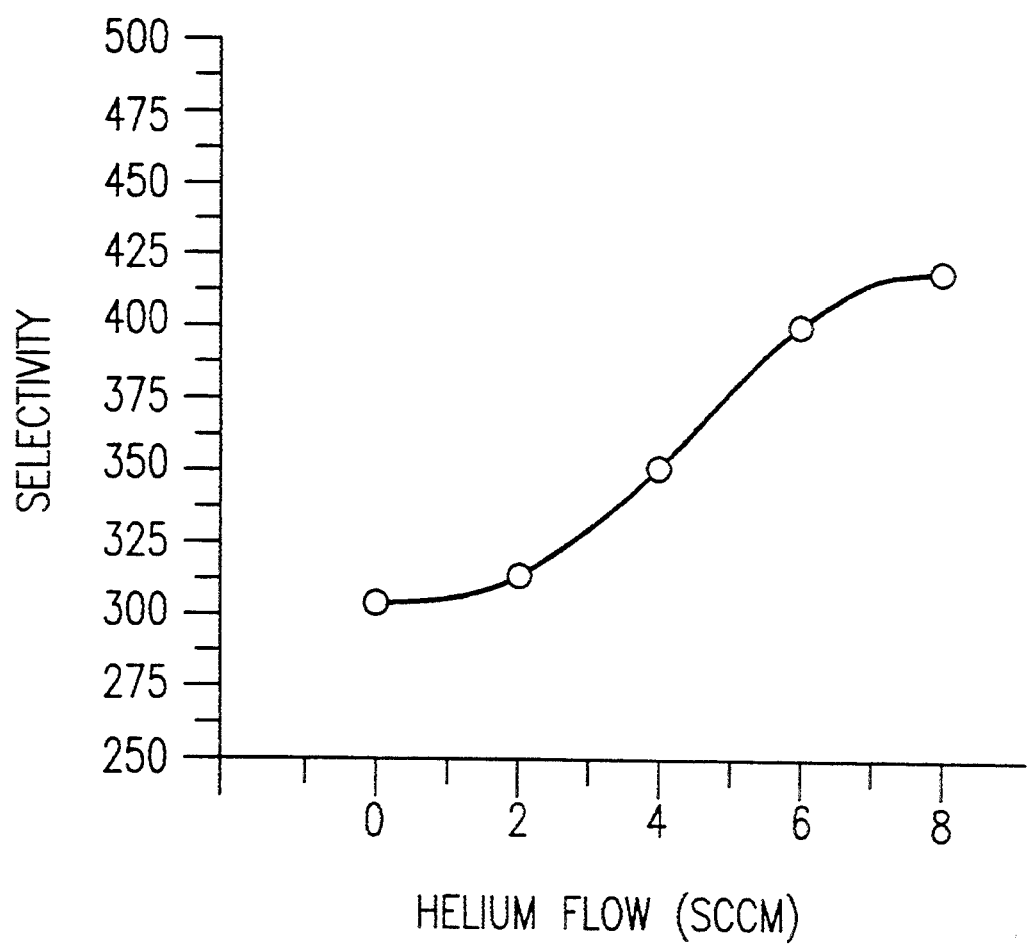
FIG. 1 plots the etch selectivity of GaAs with respect to AlGaAs vertically and the He flow rate horizontally.

The invention will be described by reference to a particular embodiment. This embodiment was a field-effect transistor(FET) structure which had a recessed gate structure and was fabricated on a Si-doped GaAs layer and an undoped AlGaAs layer. There are thus first and second semiconductors and one semiconductor comprises Al. Both layers were on an undoped semi-insulating GaAs substrate. AlGaAs is used to represent a compound semiconductor with some Al substituted for Ga. More precisely, AlGaAs is used to represent $Al_xGa_{1-x}As$ with x greater than 0.0 and less than or equal to 1.0. The precise value of x is not critical for the practice of this invention.

The FET structure will be readily fabricated by those skilled in the art. The layers will be readily grown by molecular beam epitaxy although other growth techniques may be used. The layer thickness is not critical for etching; thicknesses are selected to satisfy device performance criteria. Exemplary thicknesses are between 100 and 300 nm for the GaAs layer and 90 nm for the AlGaAs layer. Selected portions of the GaAs layer will now be removed; it is desired that the removal process stop when the AlGaAs layer is exposed. Patterning to expose the selected portions of the GaAs layer which is to be removed is done by conventional lithographic techniques. For example, resist is deposited, selectively exposed to radiation, and developed to expose selected portions of the GaAs layer. Appropriate techniques will be readily selected by those skilled in the art.

Standard plasma etch apparatus may be used for the etching process. However, the apparatus may be modified, if necessary, to increase gas throughput for the high flow, low-pressure etching of this invention. Appropriate modifications will be readily made by the skilled artisan. Commercially available gases are used; they should, of course, be free of deleterious impurities. The etch desirably produces some undercutting of the etch mask so that the gate metal which is deposited after etching does not short to the walls of the cap layer. The amount of undercutting can be controlled by varying both time and pressure.

The selectivity of the etch for GaAs with respect to $Al_{.11}Ga_{.89}$ As was determined by measuring the etch depth for several samples. The flow rates were 2.5, 10, and 6 sccm for $SiCl_4$, $CF_4/O_2$, and an inert gas, such as He, respectively. The $CF_4/O_2$ mixture was 8.5 percent $O_2$. The GaAs and AlGaAs rates were approximately 465 and 1.1 nm per minute, respectively. This yields an etch selectivity of about 420:1.

FIG. 1 plots the selectivity of GaAs with respect to AlGaAs vertically versus the He flow rate horizontally. As can be seen, the addition of He improves the etch selectivity from about 300:1 to over 400: 1. The addition of the He reduces the etch rates of both semiconductors but to different extents. It is not known with certainty why the addition of He to the etch improves the selectivity. The following hypotheses are offered. It was suggested by Ibbotson et al., *Solid State Technology*, November 1988, pp. 105–108,, that additives can control selectivity and may either be stimulating or preventing formation of passive surface layers. He is known to reduce polymer film formation in carbon based etches. The He might be interacting with the F to prevent the formation of a C and F containing film. Alternatively, the He might be interacting with the F or F containing species to reduce the volatility of the Al fluorides. This could explain the reduction of the AlGaAs etch rate while a dilution effect explains the reduced rate of GaAs etching.

Undercutting is a function of time. It was found that the lateral etch rate was significantly lower than was the vertical etch rate due to the lack of direct ion bombardment as well as flow restrictions as the etch proceeds. It was found that the amount of lateral etch increases as the square root of the etch time. This result implies a diffusion limited process. It is not known whether this is attributable to diffusion of reactant species into the undercut or to diffusion of products out of the undercut. Of course, both processes could be present. It was found that the isotropy of the etch was reduced as the pressure was reduced. When the etch was done at 5 mTorr with no He, vertical sidewalls were obtained with no apparent undercut. This suggests strongly that the addition of He prevents the etch from becoming completely anisotropic. It is possible that the He inhibits polymer sidewall formation which is otherwise responsible for the anisotropic etching.

Variations in the embodiment described will be apparent to those skilled in the art. For example, optoelectronic devices may be fabricated. Additionally, although the method was described with respect to AlGaAs and GaAs, which are Al-containing and non-Al-containing semiconductors, respectively, it may be used with other Al-containing and non-Al-containing Group III-V semiconductors. Furthermore, for some applications, a blanket etch may be used without patterning the GaAs layer. Lastly, inert gases other than He may be used.

I claim:

1. A method of fabricating a semiconductor device, said device comprising first and second semiconductors, one of said first and second semiconductors comprises Al, by the step of etching said first and said second semiconductors in a mixture consisting essentially of $SiCl_4$, $CF_4$, $O_2$, and an inert gas.

2. A method as recited in claim 1 in which said inert gas comprises He.

3. A method as recited in claim 2 comprising the further step of patterning a resist to expose selected portions of said first semiconductor layer.

4. A method as recited in claim 3 in which said first and second semiconductors comprise Group III-V semiconductors.

5. A method as recited in claim 4 in which said second semiconductor comprises AlGaAs.

6. A method as recited in claim 5 comprising the further step of obtaining a desired selectivity between GaAs and AlGaAs by using a determined amount of He.

7. A method as recited in claim 6 comprising the further step of producing a desired amount of undercutting in said GaAs layer.

* * * * *